United States Patent
Yang

(10) Patent No.: US 11,435,631 B2
(45) Date of Patent: Sep. 6, 2022

(54) PIXEL STRUCTURE AND DISPLAY DEVICE

(71) Applicants: HKC CORPORATION LIMITED, Shenzhen (CN); CHONGQING HKC OPTOELECTRONICS TECHNOLOGY CO., LTD., Chongqing (CN)

(72) Inventor: Yanna Yang, Chongqing (CN)

(73) Assignees: HKC Corporation Limited, Guangdong (CN); Chongqing HKC Optoelectronics Technology Co. Ltd., Chongqing (CN)

( * ) Notice: Subject to any disclaimer, the term of this patent is extended or adjusted under 35 U.S.C. 154(b) by 737 days.

(21) Appl. No.: 16/331,033

(22) PCT Filed: Nov. 26, 2018

(86) PCT No.: PCT/CN2018/117386
§ 371 (c)(1),
(2) Date: Mar. 6, 2019

(87) PCT Pub. No.: WO2020/019603
PCT Pub. Date: Jan. 30, 2020

(65) Prior Publication Data
US 2021/0382361 A1 Dec. 9, 2021

(30) Foreign Application Priority Data
Jul. 25, 2018 (CN) .......................... 201810827391.2

(51) Int. Cl.
*G02F 1/1362* (2006.01)
*G02F 1/1368* (2006.01)
*H01L 27/32* (2006.01)

(52) U.S. Cl.
CPC ...... *G02F 1/136286* (2013.01); *G02F 1/1368* (2013.01); *G02F 1/136209* (2013.01); *H01L 27/3248* (2013.01); *G02F 1/13624* (2013.01)

(58) Field of Classification Search
CPC ......... G02F 1/136286; G02F 1/136209; G02F 1/1368; G02F 1/13624; H01L 27/3248
(Continued)

(56) References Cited

U.S. PATENT DOCUMENTS 8,189,155 B2 * 5/2012 Chan .................... G02F 1/13624
349/130
8,330,921 B2 * 12/2012 Tsao ................... G02F 1/133707
349/129
(Continued)

FOREIGN PATENT DOCUMENTS

CN 1959507 A 5/2007
CN 102023420 A 4/2011
(Continued)

OTHER PUBLICATIONS

International Search Report Issued by Foreign Patent Office in Application No. 201810827391.2.

*Primary Examiner* — David Vu
*Assistant Examiner* — Brandon C Fox
(74) *Attorney, Agent, or Firm* — Rosenberg, Klein & Lee

(57) ABSTRACT

This application discloses a pixel structure and a display device. The pixel structure includes a substrate unit, a first pixel unit, a second pixel unit, a scanning unit, a data unit, a switch unit, a shading unit and a plurality of electrode units. The first pixel unit, the second pixel unit, the scanning unit and the data unit are located on the substrate unit, respectively. The switch unit is electrically connected to the first pixel unit, the second pixel unit, the scanning unit and
(Continued)

the data unit. The shading unit is located on the first pixel unit and the second pixel unit.

19 Claims, 4 Drawing Sheets

(58) Field of Classification Search
USPC .......................................................... 257/72
See application file for complete search history.

(56) References Cited

U.S. PATENT DOCUMENTS

| | | | |
|---|---|---|---|
| 9,864,245 B2* | 1/2018 | Tien | G02F 1/133707 |
| 2008/0100767 A1* | 5/2008 | Chan | G02F 1/136259 |
| | | | 349/54 |
| 2010/0066933 A1 | 3/2010 | Oh et al. | |
| 2010/0103354 A1 | 4/2010 | Yu et al. | |
| 2010/0195034 A1* | 8/2010 | Lee | G02F 1/134309 |
| | | | 349/124 |
| 2015/0177569 A1* | 6/2015 | Zhang | G02F 1/133707 |
| | | | 349/42 |

FOREIGN PATENT DOCUMENTS

| | | |
|---|---|---|
| CN | 102662280 A | 9/2012 |
| TW | 102109723 A | 6/2011 |

\* cited by examiner

PIXEL STRUCTURE AND DISPLAY DEVICE

RELATED APPLICATIONS

This application is a U.S. National Stage of PCT Application No. PCT/CN2018/117386 filed on Nov. 26, 2018 which claims the benefit of Chinese Patent Application No. 2018108273912, filed with the Chinese Patent Office on Jul. 25, 2018 and entitled "PIXEL STRUCTURE AND DISPLAY DEVICE", which are incorporated herein by reference in their entirety.

TECHNICAL FIELD

This application relates to a pixel structure and a display device and particularly relates to a pixel structure capable of increasing a viewing angle, reducing light leakage and improving display quality, and a display device thereof.

BACKGROUND

Polymer stabilized vertical alignment (PSVA) refers to a technology in which liquid crystal materials are doped with certain amounts of monomer compounds, shaken uniformly, subjected to a series of temperature changes, and have the liquid crystal mixture injected into a liquid crystal cell between a CF substrate and an Array substrate and pressurized. A voltage is applied to stabilize the arrangement of liquid crystal molecules, after which monomers are subjected to polymerization reaction by virtue of an ultraviolet irradiation in order to generate a polymer layer so as to realize stabilized alignment. The pixel design of the PSVA allows the liquid crystal molecules to preliminarily form pre-tilt angles. The liquid crystal molecules deflect under the action of an electric field provided by pixel electrodes and shared electrodes, and form a plurality of regions according to different shapes of the pixel electrodes, thereby improving the contrast ratio and lightness of a thin film transistor liquid crystal display (TFT LCD).

However, due to the irregular electric field distribution, the liquid crystal molecules near the adjacent regions of the pixel structure and near the shared electrodes have a disordered arrangement, resulting in panel light leakage, insufficient chroma generation by the liquid crystal and poor performance of viewing angle. In order to reduce the occurrence of light leakage due to disordered arrangement of the liquid crystal molecules, crossed open trunks are generally provided in the middles of the pixel electrodes, and other branches extend outward along the trunks, so that the central crossed trunks are displayed in a dark state in pixel regions so as to reduce the permeability of backlight.

SUMMARY

In view of the technical problems above in the prior art, this application provides a pixel structure and a display device, to solve the defects in the prior art.

In view of the problems above in the prior art, this application provides a pixel structure, comprising a substrate unit, a first pixel unit, a second pixel unit, a scanning unit, at least one data unit, a switch unit, a shading unit and a plurality of electrode units. The first pixel unit is located on the substrate unit and is provided with a plurality of first pixel branches, wherein the plurality of first pixel branches extends from the center of the first pixel unit towards the edge of the substrate unit. The second pixel unit is located on the substrate unit adjacent to the first pixel unit, and provided with a plurality of second pixel branches, wherein the plurality of second pixel branches extends from the center of the second pixel unit towards the edge of the substrate unit or the edge of the first pixel unit. The scanning unit is located on the substrate unit. The at least one data unit is located on the substrate unit. The switch unit is electrically connected to the first pixel unit, the second pixel unit, the scanning unit and the at least one data unit. The shading unit is located on the first pixel unit and the second pixel unit. The plurality of electrode units is located on the first pixel unit and the second pixel unit, respectively.

According to an aspect of this application, this application also provides a pixel structure, comprising a substrate unit; a first pixel unit located on the substrate unit and provided with a plurality of first pixel branches, wherein the plurality of first pixel branches extends from the center of the first pixel unit towards the edge of the substrate unit; a second pixel unit located on the substrate unit, adjacent to the first pixel unit and provided with a plurality of second pixel branches, wherein the plurality of second pixel branches extends from the center of the second pixel unit towards the edge of the substrate unit or the edge of the first pixel unit; a scanning unit located on the substrate unit; at least one data unit located on the substrate unit; a first switch element electrically connected to the first pixel unit, the scanning unit and the at least one data unit; a second switch element electrically connected to the second pixel unit, the scanning unit, the at least one data unit and the first switch unit; a shading unit located on the first pixel unit and the second pixel unit, wherein an overlapping position of the shading unit and the second pixel unit with one of the electrode units is provided with an opening portion; and a plurality of electrode units located on the first pixel unit and the second pixel unit, respectively.

According to an aspect of this application, this application also provides a display device, comprising a plurality of pixel structures arranged on a substrate. Each pixel structure comprises a first pixel unit, a second pixel unit, a scanning unit, at least one data unit, a switch unit, a shading unit and a plurality of electrode units, wherein the first pixel unit is located on the substrate and is provided with a plurality of first pixel branches, and the plurality of first pixel branches extends from the center of the first pixel unit towards the edge of the substrate; the second pixel unit is located on the substrate, is adjacent to the first pixel unit and is provided with a plurality of second pixel branches, and the plurality of second pixel branches extends from the center of the second pixel unit towards the edge of the substrate and the edge of the first pixel unit; the scanning unit is located on the substrate; the at least one data unit is located on the substrate; the switch unit is electrically connected to the first pixel unit, the second pixel unit, the scanning unit and the at least one data unit; the shading unit is located on the first pixel unit and the second pixel unit; and the plurality of electrode units is located on the first pixel unit and the second pixel unit, respectively.

Therefore, this application provides a novel pixel structure capable of increasing the viewing angle and improving the aperture ratio and a display device thereof. By using the first pixel unit and the second pixel unit, the whole substrate unit is divided into a plurality of regions to realize a wide viewing angle and reduction of color shift. In addition, occurrences of disordered crossed liquid crystal orientation are treated in multiple manners so that the light leakage is reduced, and furthermore the aperture ratio can be improved.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

LIST OF REFERENCE NUMERALS

Figure 1:
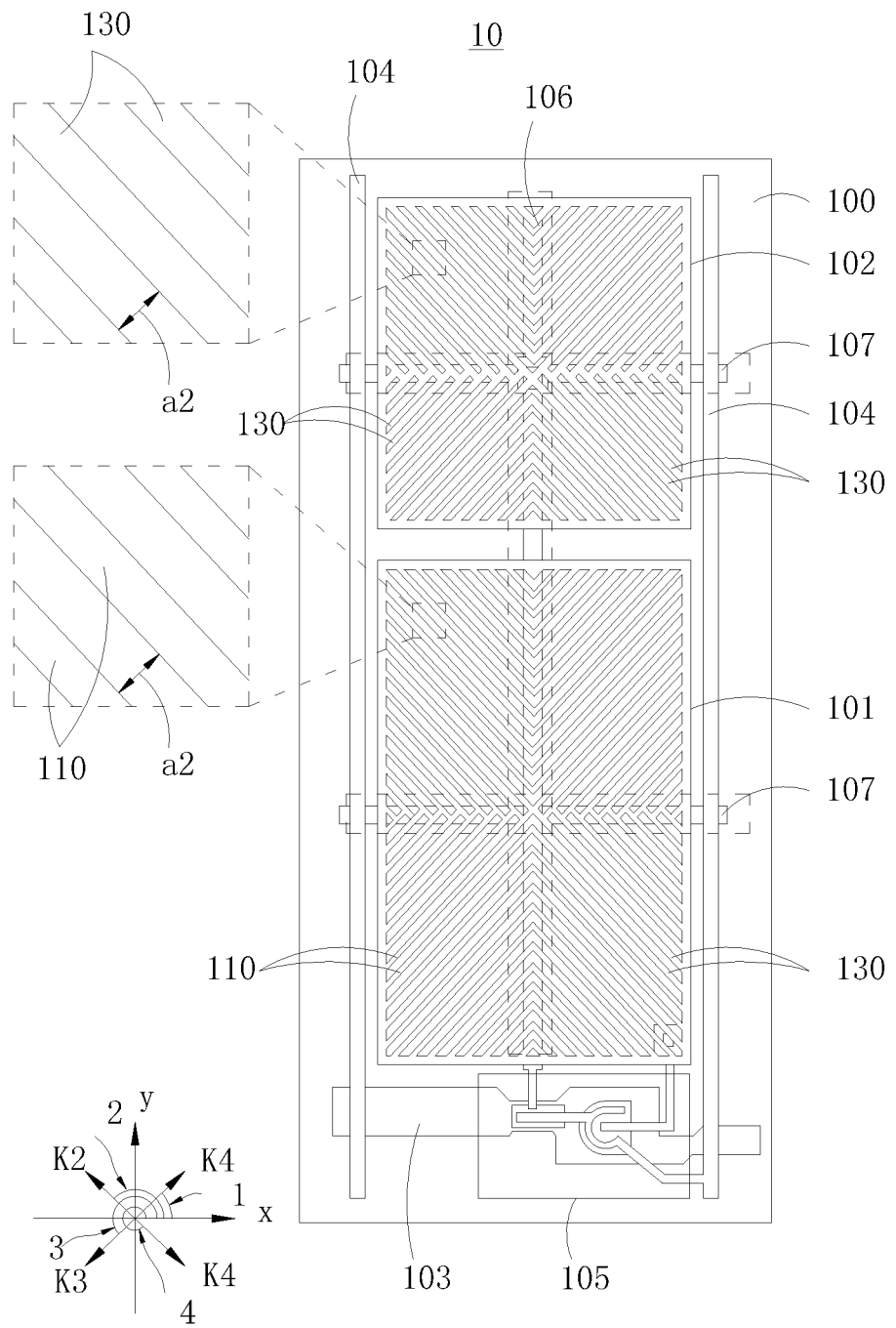
FIG. 1 shows a first schematic structural diagram of a pixel structure according to an embodiment of this application.

Pixel structure 10
Substrate unit 100
First pixel unit 101
First pixel branches 110
First peripheral element 120
Second pixel unit 102
Second pixel branches 130
Second peripheral element 140
Opening portion 150
Scanning unit 103
Data unit 104
Switch unit 105
First switch element 160
Second switch element 170
Shading unit 106
Electrode unit 107
Display device 20
Substrate 200

DETAILED DESCRIPTION OF THE EMBODIMENTS

In order to facilitate the understanding of the technical features, contents and advantages of this application and the effects that can be achieved, this application is described in detail with reference to embodiments and the accompanying drawings. The drawings used therein are for the purpose of illustration and explanation of the specification only and are not intended to reflect true scale and precise configurations in implementation of this application. Therefore, actual embodiments in the scope of this application should not be be limited to the scope of scales and configuration relationship in the accompanying drawings.

Now the embodiments of the pixel structure and display device 20 according to this application will be described below with reference to the related drawings. For ease of understanding, the same components in the following embodiments are illustrated with the same referential signs.

Figure 2:
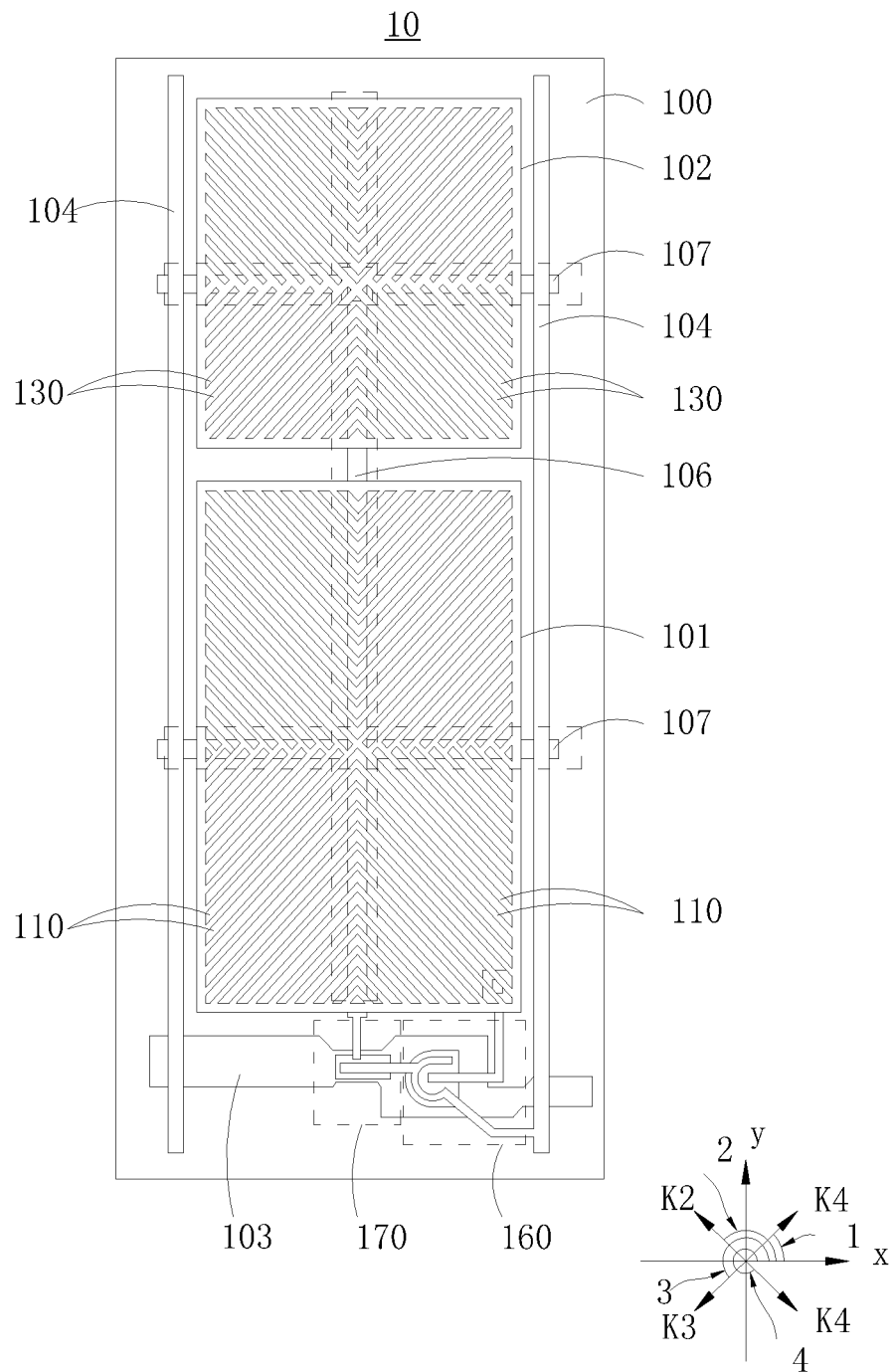
FIG. 2 shows a second schematic structural diagram of a pixel structure according to an embodiment of this application.

Now refer to FIG. 1 and FIG. 2, which are respectively the first schematic structural diagram and the second schematic structural diagram of one embodiment of a pixel structure 10 of this application. As shown in the figures, the pixel structure 10 may comprise a substrate unit 100, a first pixel unit 101, a second pixel unit 102, a scanning unit 103, at least one data unit 104, a switch unit 105, a shading unit 106 and a plurality of electrode units 107. The first pixel unit 101 may be located on the substrate unit 100 and may be provided with a plurality of first pixel branches 110, wherein the plurality of first pixel branches 110 extends from the center of the first pixel unit 101 towards the edge of the substrate unit 100. The second pixel unit 102 may be located on the substrate unit 100, may be adjacent to the first pixel unit 101 and may be provided with a plurality of second pixel branches 130, wherein the plurality of second pixel branches 130 extends from the center of the second pixel unit 102 towards the edge of the substrate unit 100 or the edge of the first pixel unit 101. The scanning unit 103 may be located on the substrate unit 100. The at least one data unit 104 may be located on the substrate unit 100. The switch unit 105 may be electrically connected to the first pixel unit 101, the second pixel unit 102, the scanning unit 103 and the at least one data unit 104. The shading unit 106 may be located on the first pixel unit 101 and the second pixel unit 102. The plurality of electrode units 107 may be located on the first pixel unit 101 and the second pixel unit 102, respectively.

Specifically, the pixel structure 10 of this application may comprise the substrate unit 100, the first pixel unit 101, the second pixel unit 102, the scanning unit 103, the at least one data unit 104, the switch unit 105, the shading unit 106 and the plurality of electrode units 107. The substrate unit 100 may be glass, quartz, organic polymer or opaque/reflective material, such as a conductive material, wafer, ceramic or other suitable materials. Each of the first pixel unit 101 and the second pixel unit 102 may be a transparent conductive layer, comprising metal oxides, such as indium-tin oxide, indium-zinc oxide, aluminum-tin oxide, aluminum-zinc oxide, indium-germanium-zinc oxide, or other suitable oxides, or a stacking layer of at least two of the above metal oxides. Each of the scanning unit 103 and the at least one data unit 104 may be a general metal material or other conductive materials, such as an alloy; nitrides of the metal material, oxides of the metal material, nitrogen oxides of the metal material, or a stacking layer of the metal material and other conductive materials. The switch unit 105 may be a TFT. The shading unit 106 may be a metal wire.

Further, the first pixel unit 101 and the second pixel unit 102 may be vertically arranged on the substrate unit 100. A gap may be provided between the first pixel unit 101 and the second pixel unit 102. The first pixel unit 101 may comprise a plurality of first pixel branches 110, and the plurality of first pixel branches 110 extends from the center of the first pixel unit 101 towards the edge of the substrate unit 100 or the edge of the second pixel unit 102. Relatively, the second pixel unit 102 may be located on the substrate unit 100, may be adjacent to the first pixel unit 101 and also may comprise a plurality of second pixel branches 130, and the plurality of second pixel branches 130 extends from the center of the second pixel unit 102 towards the edge of the substrate unit 100 or the edge of the first pixel unit 101. As shown in the figure, the plurality of first pixel branches 110 and the plurality of second pixel branches 130 separately extend from the central region to the outside at equal angles of θ1, θ2, θ3 and θ4 (45 degrees, 135 degrees, 225 degrees and 315 degrees). As shown in the figure, the X axis of the coordinate axis may be parallel to the horizontal dotted line of the crossed dotted line and the scanning unit 103, and the Y axis of the coordinate axis may be parallel to the vertical dotted line of the crossed dotted line and the data unit 104. Furthermore, a first gap a1 may be provided between two adjacent first pixel units 110, and a second gap a2 may be provided between two adjacent second pixel units 130. At least a part of the first pixel branches 110 may be alternately connected to each other and form a broken-line type image, and relatively, at least a part of the second pixel branches 130 may be alternately connected to each other and also form a broken-line type image, as shown in the horizontal dotted line of the crossed dotted line in FIG. 1. The scanning unit 103 and the data unit 104 may be perpendicular to each other and may be located on the substrate unit 100. In this embodiment, a plurality of data units 104 may be exemplified but not limited thereto. The switch unit 105 may be electrically connected to the first pixel unit 101, the second pixel unit 102, the scanning unit 103 and the data unit 104. The shading unit 106 may be located on the first pixel unit 101 and the second pixel unit 102 and may be corresponding to the vertical dotted line of the crossed dotted line. The shading unit 106 may be provided by extending an end of the first pixel unit 101 that is distal to the second pixel unit 102 towards an end of the second pixel unit 102 that is distal to the first pixel unit 101 and passes through the second pixel unit 102, as shown in FIG. 1. The plurality of electrode units 107 may be located on the first pixel unit 101 and the second pixel unit 102, respectively and may be corresponding to the horizontal dotted line of the crossed dotted line.

Therefore, the pixel structure 10 of this application uses the first pixel unit 101 and the second pixel unit 102 to divide the pixel region on the whole substrate unit 100 into a plurality of regions so as to realize the wide viewing angle and reduce the color shift In another embodiment, the switch unit 105 of this application may comprise a first switch element 160 and a second switch element 170. Each of the first switch element 160 and the second switch element 170 may be a TFT. The first switch element 160 may be electrically connected to the first pixel unit 101, the scanning unit 103 and the data unit 104. The second switch element 170 may be electrically connected to the second pixel unit 102, the scanning unit 103, the data unit 104 and the first switch unit 160.

Furthermore, in this embodiment, the shading unit 106 may be provided by extending an end of the first pixel unit 101 that is distal to the second pixel unit 102 towards the center of the second pixel unit 102, and the shading unit 106 may not completely pass through the second pixel unit 102, as shown in FIG. 2. The shading unit 106 may shade the residual part of the second pixel unit 102 by using other non-metallic shading materials having a same width as the wire.

Therefore, the first switch element 160 and the second switch element 170 in the pixel structure 10 of this application may be electrically connected, and the capacitance between the shading unit 106 and the first pixel unit 101 can enable the first pixel unit 101 and the second pixel unit 102 to have different voltages so as to realize multi-direction deflection of liquid crystal and to increase the viewing angle. The shading unit 106 supplies power to the first pixel unit 101 and the second pixel unit 102 by vias. In addition, occurrences of disordered crossed liquid crystal orientation are treated in multiple manners so that the light leakage is reduced, and furthermore the aperture ratio can be improved.

Figure 3:
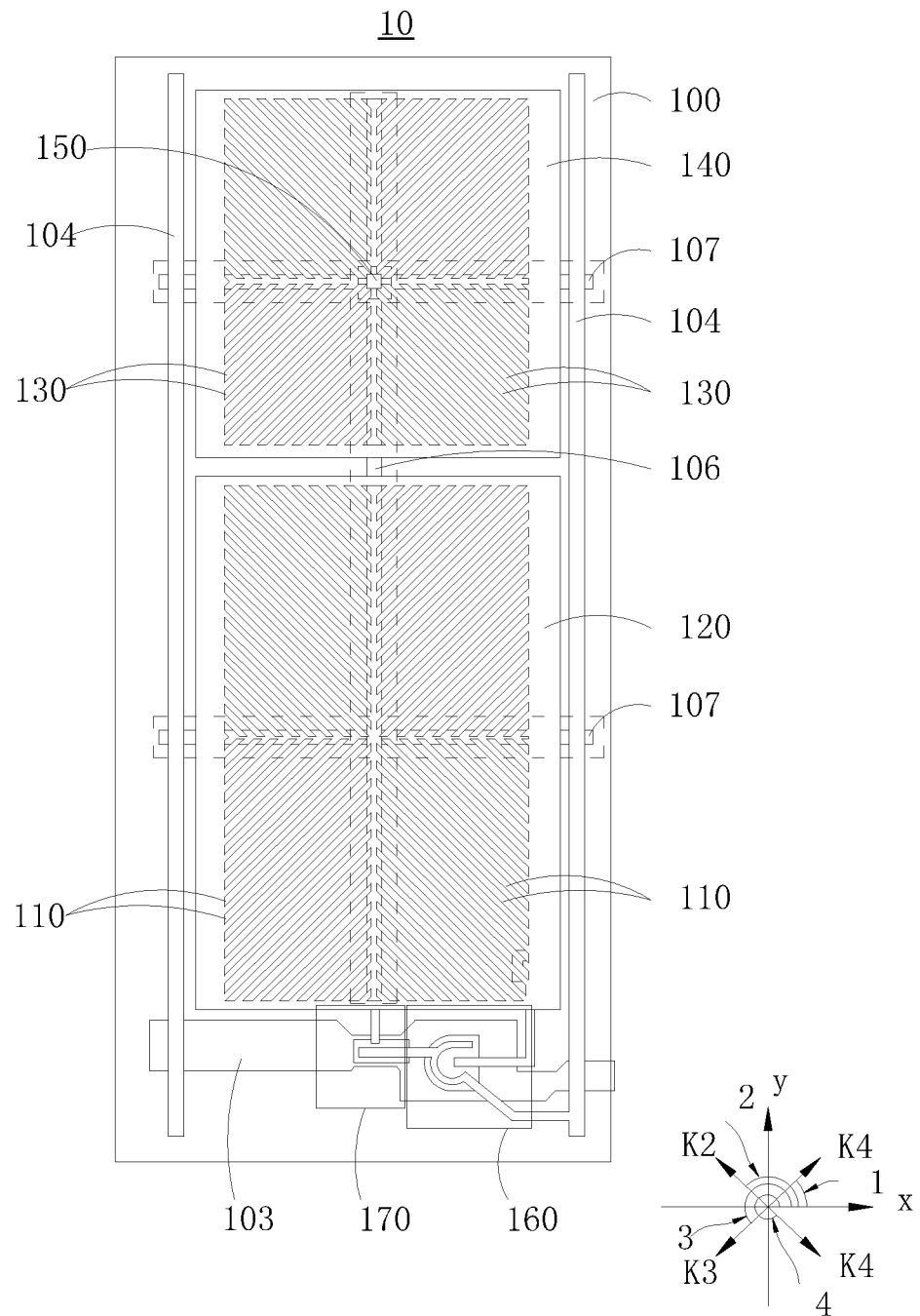
FIG. 3 shows a schematic structural diagram of a pixel according to another embodiment of this application.

Now refer to FIG. 3, which is a schematic structural diagram of a second embodiment of the pixel structure 10 of this application, and together with FIG. 1 and FIG. 2. As shown in the figures, compared with the previous embodiment, the pixel structure 10 in the embodiment may have a similar manner of actuation of the same components, which will not be elaborated here again. However, it should be noted that, in this embodiment, the edge of the first pixel unit 101 may be further provided with a first peripheral element 120 connected to an end of each first pixel branch 110 proximal to the edge of the substrate unit 100. Optionally, the other ends of two adjacent first pixel branches 110 may be not connected to each other. Correspondingly, the edge of the second pixel unit 102 may be further provided with a second peripheral element 140 connected to an end of each second pixel branch 130 proximal to the edge of the substrate unit 100 or the edge of the first pixel unit 101. Optionally, the other ends of two adjacent second pixel branches 130 may be not connected to each other.

For example, in the first pixel unit 101 and the second pixel unit 102 in the pixel structure 10 of this application, the other ends of two adjacent first pixel branches 110 and the other ends of two adjacent second pixel branches 130 corresponding to the crossed dotted line may be not connected to each other. The pixel structure 10 of this application may be further provided with an opening portion 150 in an overlapping position of the second pixel unit 102 and the shading unit 106 with the electrode unit 107.

Therefore, the pixel structure 10 of this application changes liquid crystal orientation from inward to outward by adopting a hollowed design on the portion of the crossed dotted lines and connecting the branches via the peripheries of the first pixel unit 101 and the second pixel unit 102. As a result, the dark line region of the middle cross of a pixel electrode may be substantially reduced, while shading is no longer needed, thereby reducing the risk of light leakage and greatly improving the aperture ratio.

Figure 4:
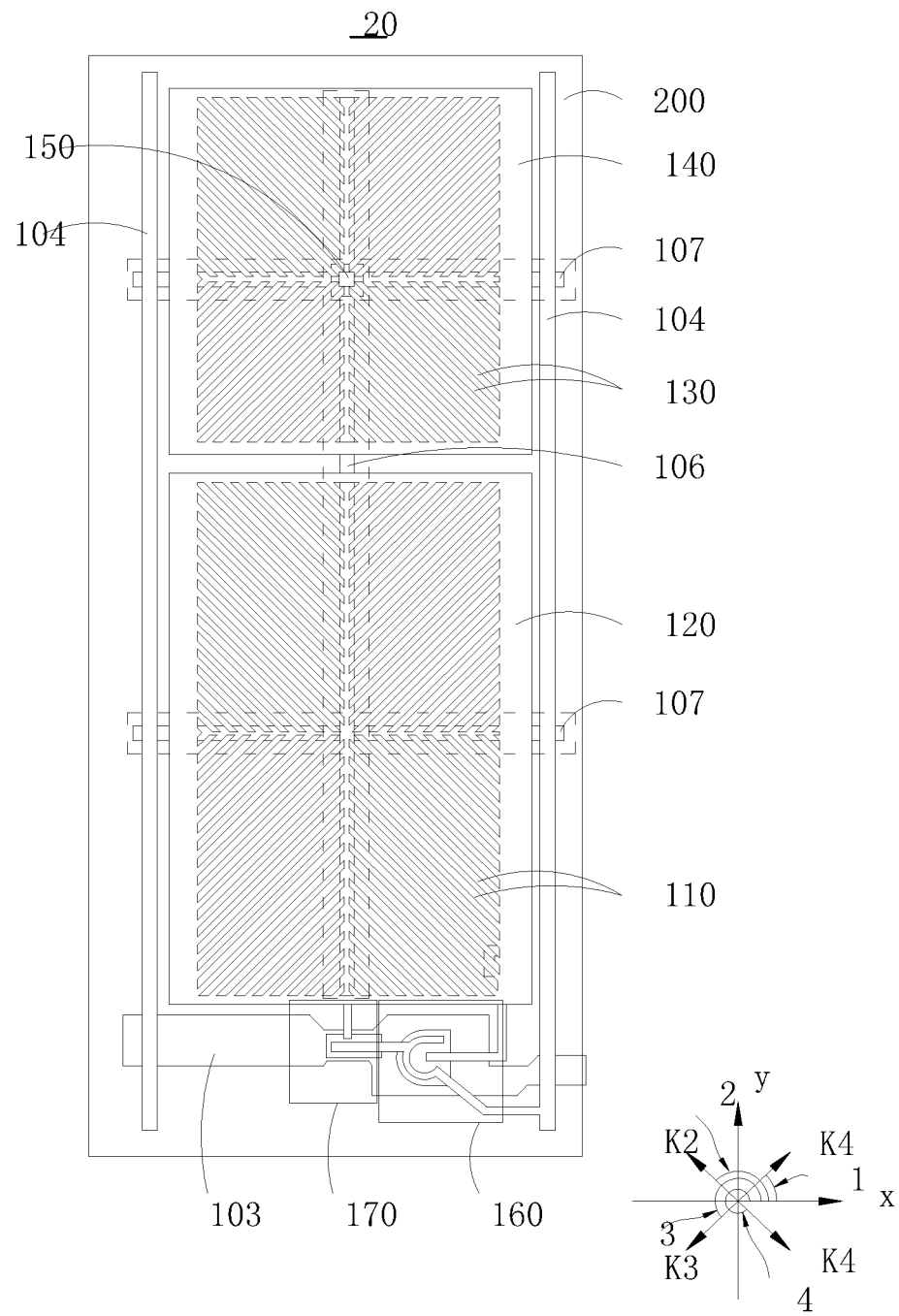
FIG. 4 shows a schematic structural diagram of a display device according to an embodiment of this application.

Referring to FIG. 4 again, this application also provides a display device 20, comprising a plurality of pixel structures 10 and a substrate 200. The pixel structure may be equivalent to the pixel structures 10 described in the foregoing embodiments, and the substrate 200 may be equivalent to the substrate units 100 described in the foregoing embodiments, which will not be elaborated here again.

The above contents are only illustrative but not intended to limit the application in any aspect. Equivalent modifications or variations without departing from the spirit and scope of this application should be considered as falling within the scope of the appended claims.

What is claimed is:
1. A pixel structure, comprising:
a substrate unit;
a first pixel unit located on the substrate unit and provided with a plurality of first pixel branches, wherein the plurality of first pixel branches extends from a center of the first pixel unit towards an edge of the substrate unit;
a second pixel unit located on the substrate unit, adjacent to the first pixel unit, and provided with a plurality of second pixel branches, wherein the plurality of second pixel branches extends from a center of the second pixel unit towards an edge of the substrate unit or the edge of the first pixel unit;
a scanning unit located on the substrate unit;
at least one data unit located on the substrate unit;
a switch unit electrically connected to the first pixel unit, the second pixel unit, the scanning unit and the at least one data unit;
a shading unit located on the first pixel unit and the second pixel unit, wherein the shading unit extends from an end of the first pixel unit that is distal to the second pixel unit towards the center of the second pixel unit, and the shading unit does not completely pass through the second pixel unit, and wherein in a extension direction of the shading unit, a residual part of the second pixel unit where the shading unit doesn't pass through is shaded by a non-metallic shading material having a same width as the shading unit; and a plurality of electrode units located on the first pixel unit and the second pixel unit, respectively.

2. The pixel structure according to claim 1, wherein a first gap is provided between two adjacent first pixel units, and a second gap is provided between two adjacent second pixel units.

3. The pixel structure according to claim 1, wherein the switch unit comprises:
   a first switch element electrically connected to the first pixel unit, the scanning unit and the at least one data unit; and
   a second switch element electrically connected to the second pixel unit, the scanning unit, the at least one data unit and the first switch unit.

4. The pixel structure according to claim 1, wherein the edge of the first pixel unit is further provided with a first peripheral element connected to an end of each first pixel branch proximal to the edge of the substrate unit.

5. The pixel structure according to claim 4, wherein other ends of two adjacent first pixel branches are not connected to each other.

6. The pixel structure according to claim 1, wherein the edge of the second pixel unit is further provided with a second peripheral element connected to an end of each second pixel branch proximal to the edge of the substrate unit or the edge of the first pixel unit.

7. The pixel structure according to claim 6, wherein other ends of two adjacent second pixel branches are not connected to each other.

8. The pixel structure according to claim 1, wherein an overlapping position of the second pixel unit and the shading unit with one of the electrode units is provided with an opening portion.

9. The pixel structure according to claim 1, wherein at least a part of the first pixel branches is alternately connected to each other and form a broken-line type image, and at least a part of the second pixel branches is alternately connected to each other and form a broken-line type image.

10. A display device, comprising:
    a plurality of pixel structures arranged on a substrate, wherein each of the plurality of pixel structures comprises:
    a first pixel unit located on the substrate and provided with a plurality of first pixel branches, wherein the plurality of first pixel branches extends from a center of the first pixel unit towards an edge of the substrate;
    a second pixel unit located on the substrate, adjacent to the first pixel unit and provided with a plurality of second pixel branches, wherein the plurality of second pixel branches extends from a center of the second pixel unit towards an edge of the substrate and the edge of the first pixel unit;
    a scanning unit located on the substrate;
    at least one data unit located on the substrate;
    a switch unit electrically connected to the first pixel unit, the second pixel unit, the scanning unit and the at least one data unit;
    a shading unit located on the first pixel unit and the second pixel unit, wherein the shading unit extends from an end of the first pixel unit that is distal to the second pixel unit towards the center of the second pixel unit, and the shading unit does not completely pass through the second pixel unit, and wherein in a extension direction of the shading unit, a residual part of the second pixel unit where the shading unit doesn't pass through is shaded by a non-metallic shading material having a same width as the shading unit; and
    a plurality of electrode units located on the first pixel unit and the second pixel unit, respectively.

11. The display device according to claim 10, wherein the plurality of first pixel branches and the plurality of second pixel branches extend at four extending angles, and the extending angles are 45 degrees, 135 degrees, 225 degrees and 315 degrees.

12. The display device according to claim 10, wherein a first gap is provided between two adjacent first pixel units, and a second gap is provided between two adjacent second pixel units.

13. The display device according to claim 10, wherein the switch unit comprises:
    a first switch element electrically connected to the first pixel unit, the scanning unit and the at least one data unit; and
    a second switch element electrically connected to the second pixel unit, the scanning unit, the at least one data unit and the first switch unit.

14. The display device according to claim 10, wherein the edge of the first pixel unit is further provided with a first peripheral element connected to an end of each first pixel branch proximal to the edge of the substrate unit.

15. The display device according to claim 14, wherein other ends of two adjacent first pixel branches are not connected to each other.

16. The display device according to claim 10, wherein the edge of the second pixel unit is further provided with a second peripheral element connected to an end of each second pixel branch proximal to the edge of the substrate unit or the edge of the first pixel unit.

17. The display device according to claim 16, wherein other ends of two adjacent second pixel branches are not connected to each other.

18. The display device according to claim 10, wherein an overlapping position of the second pixel unit and the shading unit with one of the electrode units is provided with an opening portion.

19. The display device according to claim 10, wherein at least a part of the first pixel branches is alternately connected to each other and form a broken-line type image, and at least a part of the second pixel branches is alternately connected to each other and form a broken-line type image.

* * * * *